(12) United States Patent
Calamita et al.

(10) Patent No.: US 11,465,407 B2
(45) Date of Patent: Oct. 11, 2022

(54) PRINT TARGETS AND IMAGE ANALYSIS FOR FEEDBACK CONTROL OF FLEXOGRAPHIC PRINTING DEVICES

(71) Applicant: Xerox Corporation, Norwalk, CT (US)

(72) Inventors: James P. Calamita, Spencerport, NY (US); Shawn P. Updegraff, Fairport, NY (US); Michael B. Monahan, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 16/942,042

(22) Filed: Jul. 29, 2020

(65) Prior Publication Data

US 2022/0032608 A1 Feb. 3, 2022

(51) Int. Cl.
*B41F 33/16* (2006.01)
*B41F 5/24* (2006.01)

(52) U.S. Cl.
CPC ............... *B41F 33/16* (2013.01); *B41F 5/24* (2013.01)

(58) Field of Classification Search
CPC ........ B41F 5/24; B41F 33/16; B41F 33/0045; B41F 33/0036; B41F 33/0072
See application file for complete search history.

(56) References Cited

U.S. PATENT DOCUMENTS

| | | | |
|---|---|---|---|
| 6,318,260 B1 | 11/2001 | Chu et al. | |
| 9,327,489 B2 | 5/2016 | Shifley et al. | |
| 9,855,738 B2 | 1/2018 | Puig Vila et al. | |
| 2012/0285341 A1 | 11/2012 | Dedman | |
| 2016/0059540 A1 | 3/2016 | Smith et al. | |
| 2017/0165956 A1 | 6/2017 | Becker | |
| 2019/0240971 A1* | 8/2019 | Gamm | B41F 33/0072 |

* cited by examiner

*Primary Examiner* — Leslie J Evanisko
*Assistant Examiner* — Leo T Hinze
(74) *Attorney, Agent, or Firm* — Caesar Rivise, PC

(57) ABSTRACT

According to aspects of the embodiments, there is provided methods to measure characteristics of line width and density of printed test patterns. By printing the test patterns and capturing with an in-line scanner or optical device, the analytical results of these test patterns can be used as feedback to a control system that adjusts both impression and inking levels without the need of a skilled operator.

20 Claims, 19 Drawing Sheets

PRINT TARGETS AND IMAGE ANALYSIS FOR FEEDBACK CONTROL OF FLEXOGRAPHIC PRINTING DEVICES

BACKGROUND

Disclosed herein are methods and systems for flexographic printing, and more particularly to a method for controlling ink setting and ink transfer pressure between cylinders by optical measurement of printed test patterns.

Flexography is a method of printing or pattern formation that is commonly used for high-volume printing runs. It is typically employed for printing on a variety of soft or easily deformed materials including, but not limited to, paper, paperboard stock, corrugated board, polymeric films, fabrics, metal foils, glass, glass-coated materials, flexible glass materials and laminates of multiple materials. Coarse surfaces and stretchable polymeric films are also economically printed using flexography.

Flexographic printing members are sometimes known as relief printing members, relief-containing printing plates, printing sleeves, or printing cylinders, and are provided with raised relief images onto which ink is applied for application to a printable substrate or media. While the raised relief images are inked, the recessed relief "floor" should remain free of ink.

Although flexographic printing has conventionally been used in the past for printing of images, more recent uses of flexographic printing have included functional printing of devices, such as touch screen sensor films, antennas, and other devices to be used in electronics or other industries. Such devices typically include electrically conductive patterns.

In flexographic printing devices, the amount of ink applied to the flexographic plate and the amount of pressure that the plate applies to the media both need to be optimized in order to achieve the best image quality. Currently, industry practice requires a skilled operator to iterate on a process that involves manually adjusting both inking and impression levels and visually inspecting the resulting print output. The adjustment of both of these levels has been motorized, so that the adjustments can be made by either pressing a button or changing a setting in a graphical user interface (GUI), but the interpretation of print quality is still performed via a skilled operator. Such a subjective interpretation of print quality leads to un-acceptable variability due to the availability of skilled operators which has been steadily declining over the last few decades.

For the above reasons there is a need in the art to have the interpretation of image quality automatically performed so that the feedback loop for optimizing impression and inking can be closed.

SUMMARY

According to aspects of the embodiments, there is provided methods to measure characteristics of line width and density of printed test patterns. By printing the test patterns and capturing with an in-line scanner or optical device, the analytical results of these test patterns can be used as feedback to a control system that adjusts both impression and inking levels without the need of a skilled operator.

DETAILED DESCRIPTION

Figure 1:
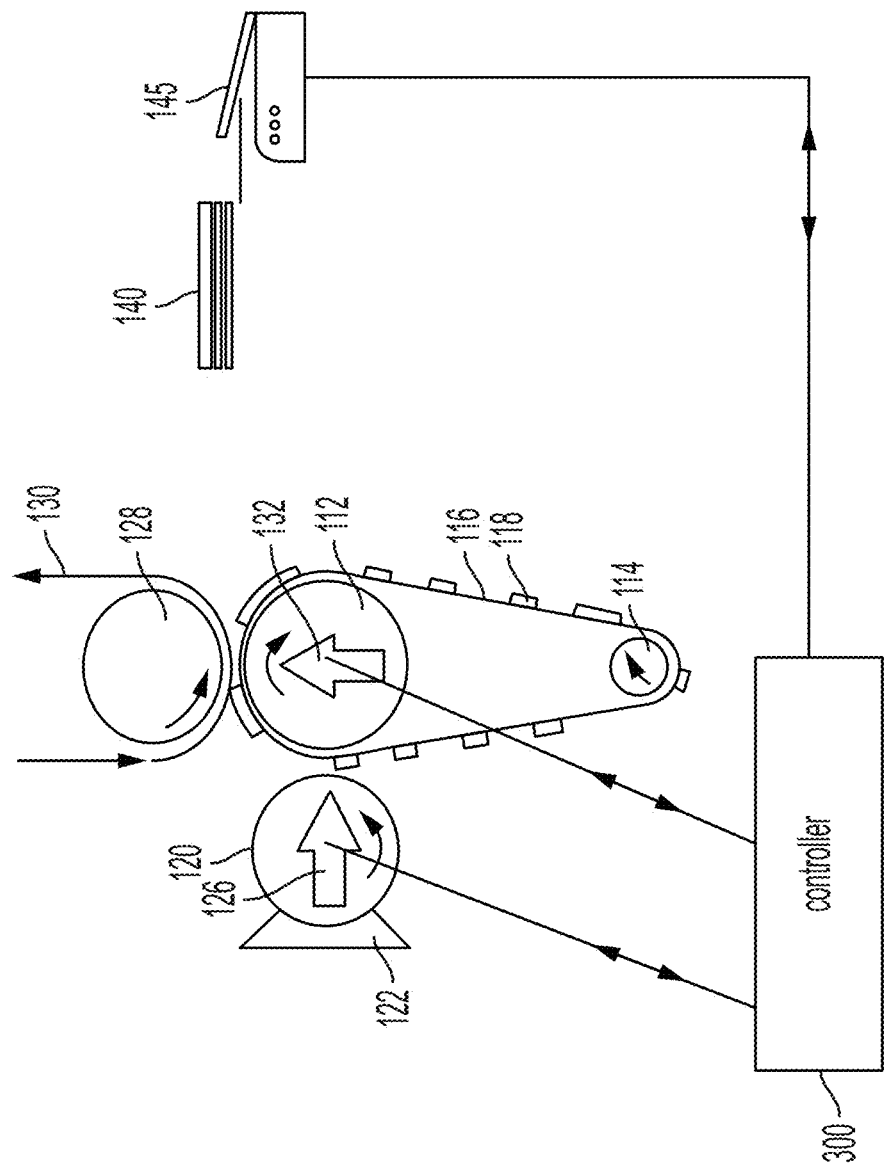
FIG. 1 illustrates a block diagram of a system for flexographic printing and with an in-line scanner for feedback to a control system that adjusts both impression and inking levels in accordance to an embodiment.

Aspects of the embodiments disclosed herein relate to methods for automatic optimization of inking and impression settings in a flexographic printing, and corresponding apparatus and computer readable medium. The disclosed embodiments propose a feedback control system for a Flexographic printing system from the imaging and analyzes of print patterns.

The disclosed embodiments include a computerized method for automatic optimization of inking and impression settings in a flexographic printing system, comprising print test patterns on at least one substrate by applying different inking levels and impression levels, wherein the test patterns are of varying shape, line thickness, orientation and spacing; using an imaging system to capture at least one image of the printed test patterns on at least one substrate at each of the inking and impression levels; analyzing the captured at least one image to determine different factors for the test patterns; and using a control system to automatically control ink setting and impression setting responsive to the determined different factors, wherein the different factors are line width and density for the printed the test patterns.

The disclosed embodiments further include a system for flexographic printing, comprising an anilox roller having a patterned surface for transferring ink based on an inking setting to a flexographic printing plate; an impression cylinder that is configured to force, based on an impression setting, at least one substrate into contact with the flexographic printing plate; a processor coupled to a storage device having instructions that, when executed by the processor cause the processor to execute a method for automatic optimization of inking setting and impression setting by: printing test patterns on the least one substrate by applying different inking levels and impression levels, wherein the test patterns are of varying shape, line thickness, orientation and spacing; using an imaging system to capture at least one image of the printed test patterns on at least one substrate at each of the inking and impression levels; analyzing the captured at least one image to determine different factors for the test patterns; and using a control system to automatically control ink setting and impression setting responsive to the determined different factors, wherein the different factors are line width and density for the printed the test patterns.

The disclosed embodiments further include printing test patterns with inking levels selected from group consisting of low ink, normal ink, and high ink; with impression levels are selected from a group consisting of low impression, normal impression, and high impression. The printed test patterns are selected from a group consisting of horizontal lines, vertical lines, quadrant horizontal and vertical lines, radial shapes, hexagonal shapes, concentric circles, and combination thereof. After the printed test patterns are converted to an electronic image where the analytical results of these test patterns can be used as feedback to a control system that adjusts both impression and inking levels.

Embodiments as disclosed herein may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, and the like that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described therein.

Although embodiments of the invention are not limited in this regard, discussions utilizing terms such as, for example, "processing," "computing," "calculating," "determining," "using," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations. The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

The term "printing device" or "printing system" as used herein refers to a apparatus or machine capable of performing flexographic printing. Further a "printing system" can handle sheets, webs, marking materials, and the like. A printing system can place marks on any surface, and the like and is any machine that reads marks on input sheets; or any combination of such machines.

The term "print media" generally refers to a usually flexible, sometimes curled, physical sheet of paper, substrate, plastic, or other suitable physical print media substrate for images, whether precut or web fed.

Identical reference numbers in the Figures refer to identical or analogous elements and descriptions of the same portions as those as in a prior embodiment will be omitted.

FIG. 1 illustrates a block diagram of a system for flexographic printing and with an in-line scanner for feedback to a control system that adjusts both impression and inking levels in accordance to an embodiment.

FIG. 1 is a depiction of a cross-section through a printing mechanism of a flexographic printing machine employing belt technology. A central element of the printing mechanism is the plate cylinder 112. It is arranged essentially parallel to a tensioning cylinder 114 at a distance from it. A flexible printing plate support 116 is slung over both. The printing plate support 116 is designed as a continuous belt and bears the printing plate, which is a relief made of elastic material fixed on the printing plate support 116. The tensioning cylinder 114 is displaceable in the direction of its perpendicular distance to the plate cylinder 112 in order to tension the printing plate support 116.

To the left of the plate cylinder in FIG. 1, a rotating inking roller 120 such as an anilox roller, which is connected to an ink reservoir 122, is arranged in essentially parallel orientation to the plate cylinder 112. When the inking roller 120 rotates, its surface is wetted with the ink. The thus inked inking roller 120 is displaced against the plate cylinder 112 with an adjustable positioning pressure 126 such as with controller 300 and thereby pressed against the printing plate 118 that runs between the plate cylinder 112 and inking roller 120. In the process, ink is transferred from the surface of the inking roller 120 to the printing plate 118.

Above the plate cylinder 112 in FIG. 1, an impression cylinder 128 is arranged in essentially parallel orientation to the plate cylinder 112. A roll-shaped printing substrate 130, e.g., a paper roll 130, is slung around it, whereby the printing substrate 130 passes through the nip between the plate cylinder 112 and the impression cylinder 128. To press the printing substrate against the printing plate 118 that runs around the plate cylinder 112, the plate cylinder 112 is displaceable against the impression cylinder 128 with an adjustable positioning pressure 132 or impression setting. The printing substrate 130 is thereby pressed against the inked printing plate 118, which results in ink being transferred from the printing plate 118 to the printing substrate 130, i.e., the actual printing process.

Continuing with FIG. 1, a scanner 145 is shown to scan selected printed substrates such as test patterns 140. The test patterns 140 consist of varying shape, line thickness, orientation and spacing. The test patterns are printed at different inking and impression settings or impression/inking combinations, after patterns are analyzed the ink level 126 and impression 132 level can be set and maintained under the control of controller 300. The scanner being set to create an electronic image test patterns 140 on the printing substrate 130. The test patterns 140 as electronic images are then analyzed at the scanner 145 or at controller 300 to determine different factors such as printed line width, darkness levels, and the like to find a measurement signal for ink and impression levels that can be used for feedback control.

Figure 2:
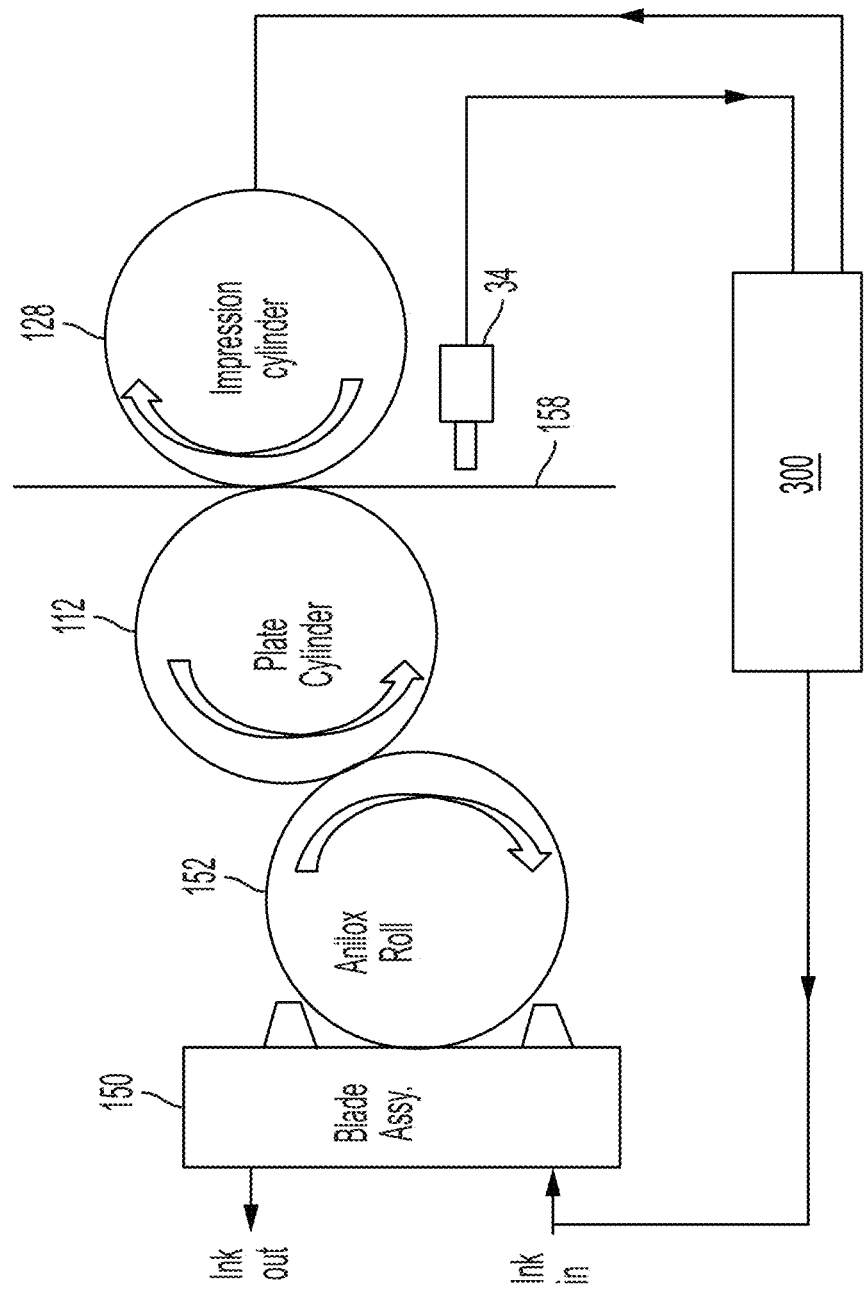
FIG. 2 illustrates a block diagram of a system for flexographic printing and with an optical device with feedback to a control system that adjusts both impression and inking levels in accordance to an embodiment.

FIG. 2 illustrates a block diagram of a system for flexographic printing and with an optical device with feedback to a control system that adjusts both impression and inking levels in accordance to an embodiment. Referring now to FIG. 2, an example of a flexographic printing of a web and using imaging device 34 to provide a feedback signal is shown. The setup may include a metering doctor blade 150 which bears on an anilox roll 152. The anilox roll 152 rotates while metering ink onto an oppositely rotating printing plate cylinder 112. The printing plate cylinder 112 impresses a printed output onto a substrate or web 158. An impression cylinder 128 provides resistance for the printing plate cylinder 112 as commanded by controller 300. In some applications, as indicated here, the metering doctor blade may be enclosed in a blade assembly and include input and output ports for metering ink under the supervision of controller 300. A sensor 34 is an imaging sensor whose output can be used by the controller to determine different factors from the printed test patterns. The result of the analyses can be used to determine the ink and impression settings best suited for the printer. One skilled in the art will recognize, however, that imaging sensor 34 without spatial resolution, such as simple photo diodes, can also be used to detect a pre-set quality of the test patterns.

Figure 3A:
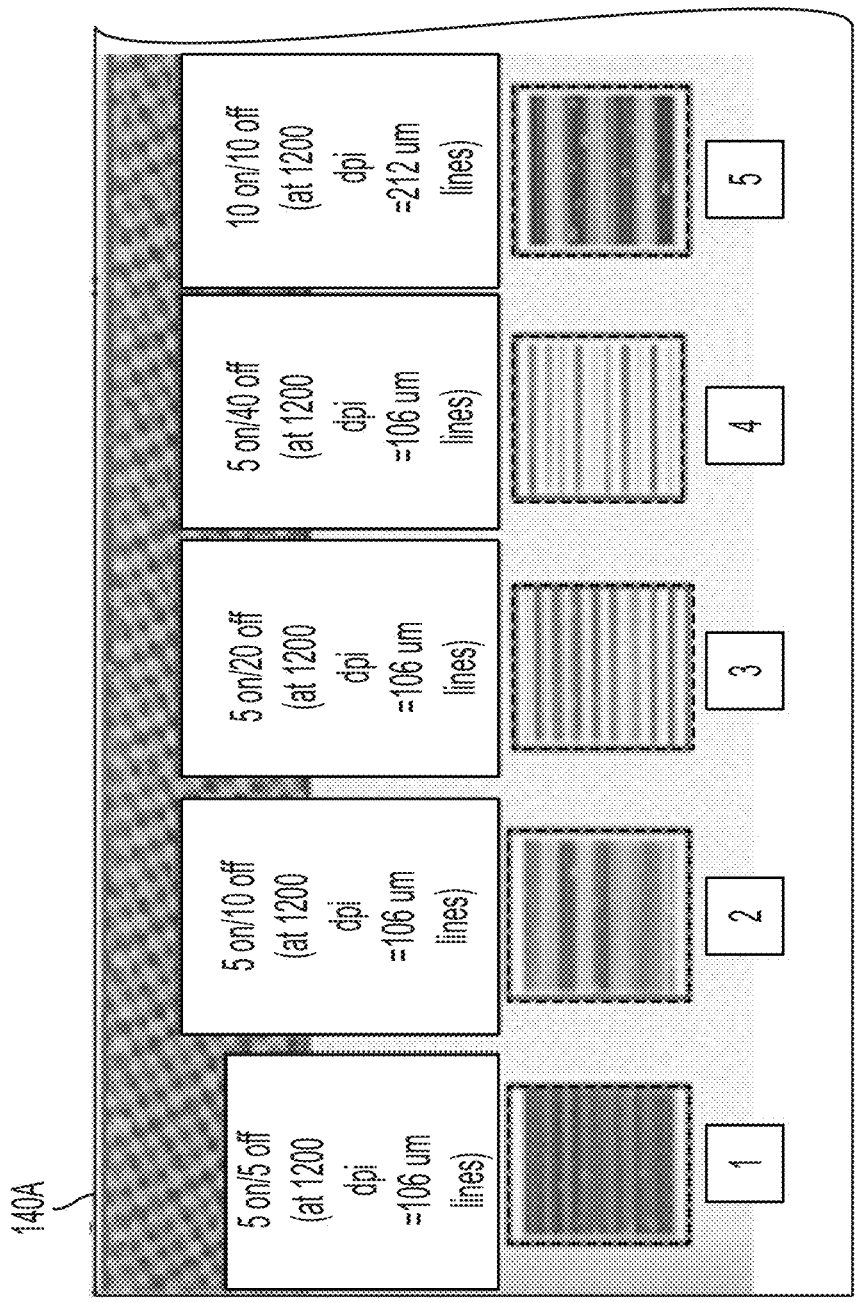
FIGS. 3A-3E and 3G-3H illustrate various test patterns useful in system of FIG. 1 or system of FIG. 2 to adjust both impression and inking levels in accordance to an embodiment.
Figure 3B:
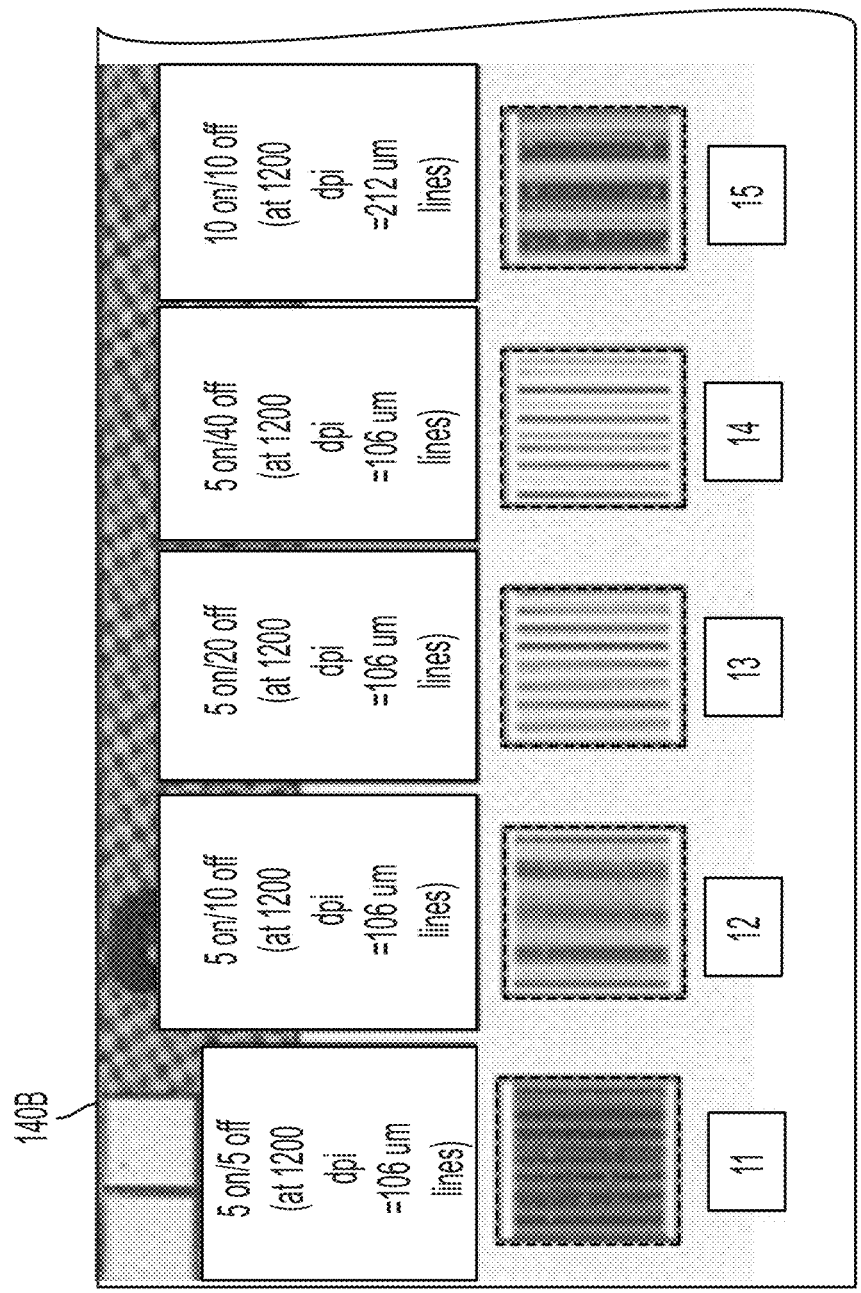
Figures 3C, 3D:
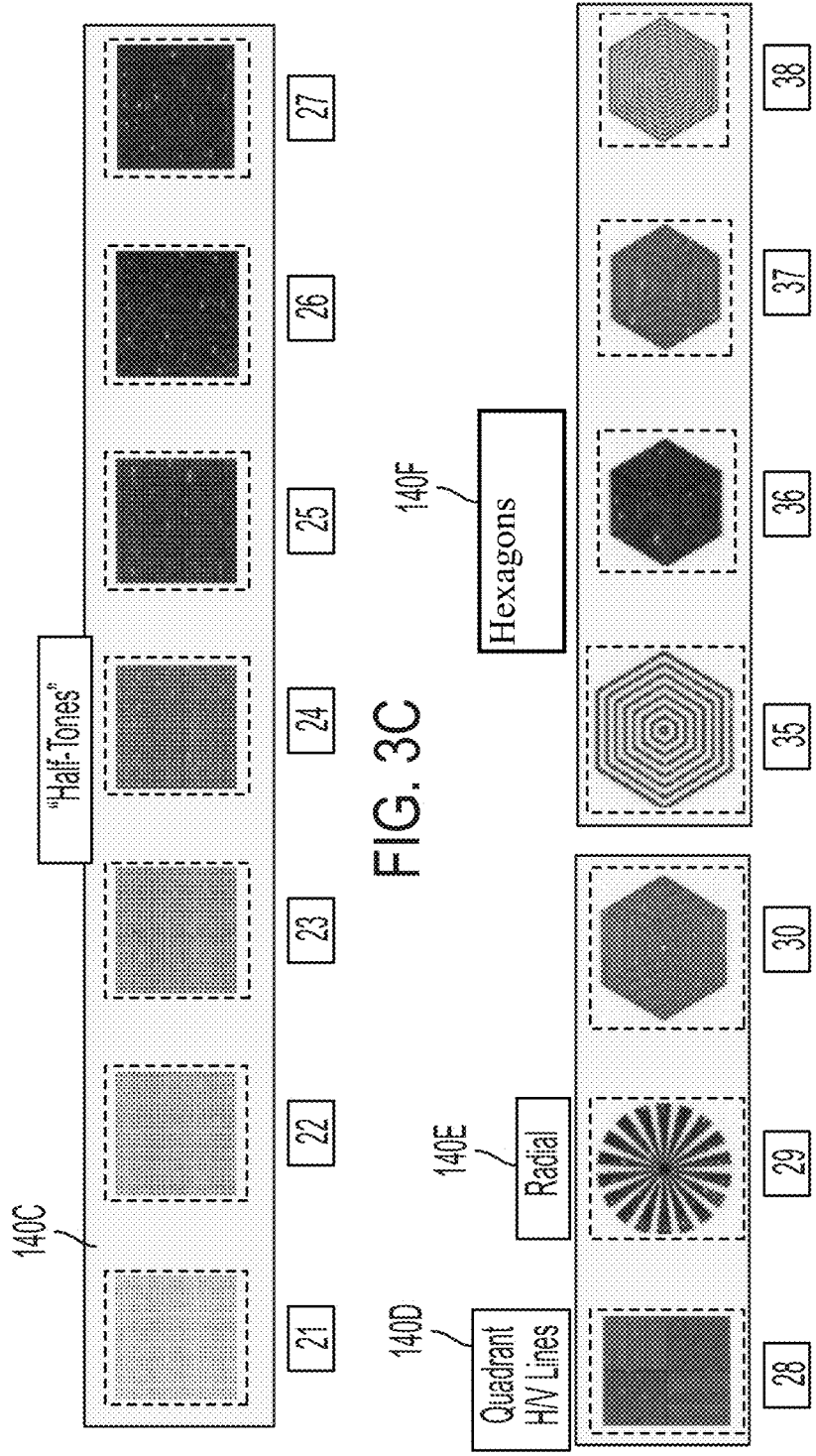
Figure 3E:
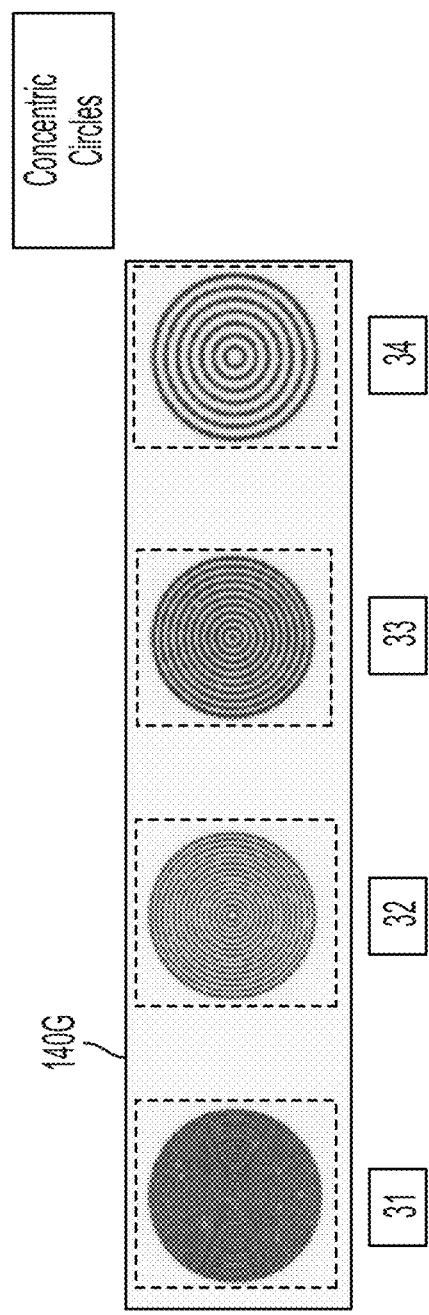
Figure 3F:
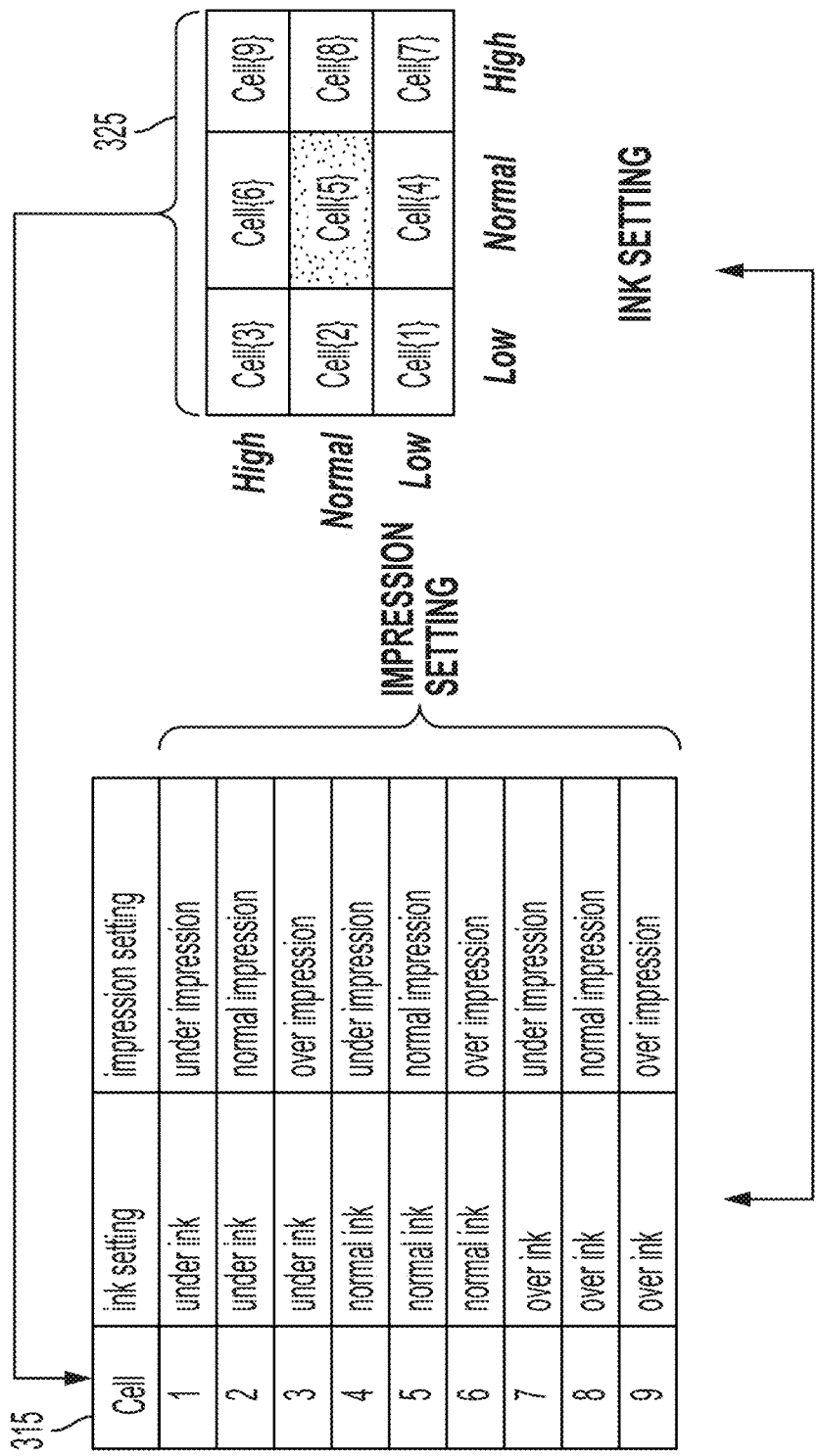
FIG. 3F illustrates an exemplary control strategy table of nine control strategies based upon three impression setting and three ink settings for feedback control of the flexographic printers illustrated in FIG. 2 and FIG. 1 in accordance to an embodiment.
Figure 3G:
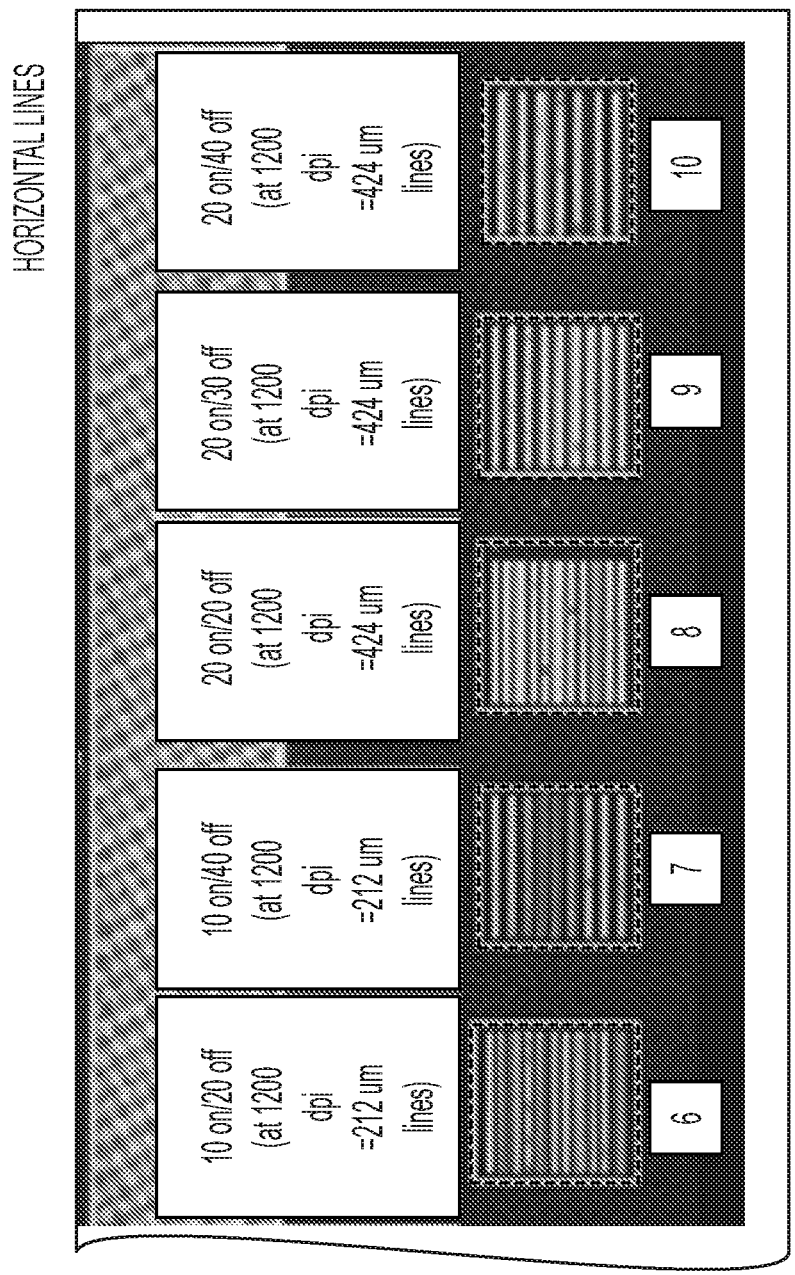
Figure 3H:
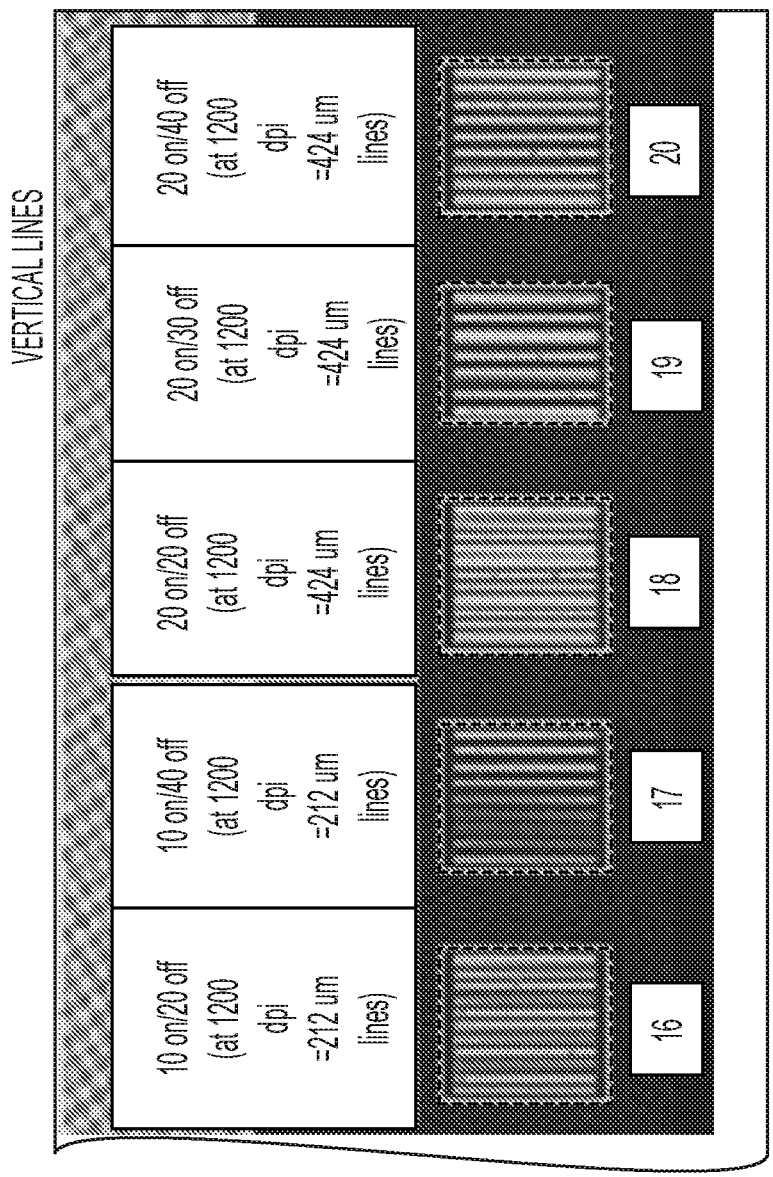

FIGS. 3A-3E and 3G-3H illustrate various test patterns useful in system of FIG.1 or system of FIG. 2 to adjust both impression and inking levels in accordance to an embodiment. FIG. 3A and FIG. 3G illustrate the test patterns 140A as horizontal lines (shown as columns 1-10) all printed at various "on" and "off" settings. FIG. 3B and FIG. 3H illustrate the test patterns 140B as vertical lines (shown as columns 11-20) all printed at various "on" and "off" settings. FIG. 3C illustrates the test patterns 140C as half-tones (shown as columns 21-27) all printed at various "on" and "off" settings. FIG. 3D illustrates the test patterns 140D (quadrant horizontal and vertical lines), 140E (radial lines), and 140F (hexagon shapes of lines) all shown as columns 28-38 all printed at various "on" and "off" settings. FIG. 3E illustrates the test patterns 140G as concentric circles (shown as columns 31-34) all printed at various "on" and "off" settings.

FIG. 3F illustrates an exemplary control strategy table of nine control strategies based upon three impression setting and three ink settings for feedback control of the flexographic printers illustrated in FIG. 2 and FIG. 1 in accordance to an embodiment. Table 315 shows ink setting and impression setting for the printed test targets 140. The data in table 315 is mapped as a two dimensional (2D) data structure having impression setting keys like high impression, normal impression, and low impression; and ink setting keys like low ink, normal ink, and high ink. The cells of the data structure encapsulate these ink and impression settings. For example, when implementing a printing strategy would select a combination of the cells to print the target test patterns, i.e., when selecting cell 5 the test pattern is printed at a normal impression and a normal ink setting.

Figure 4:
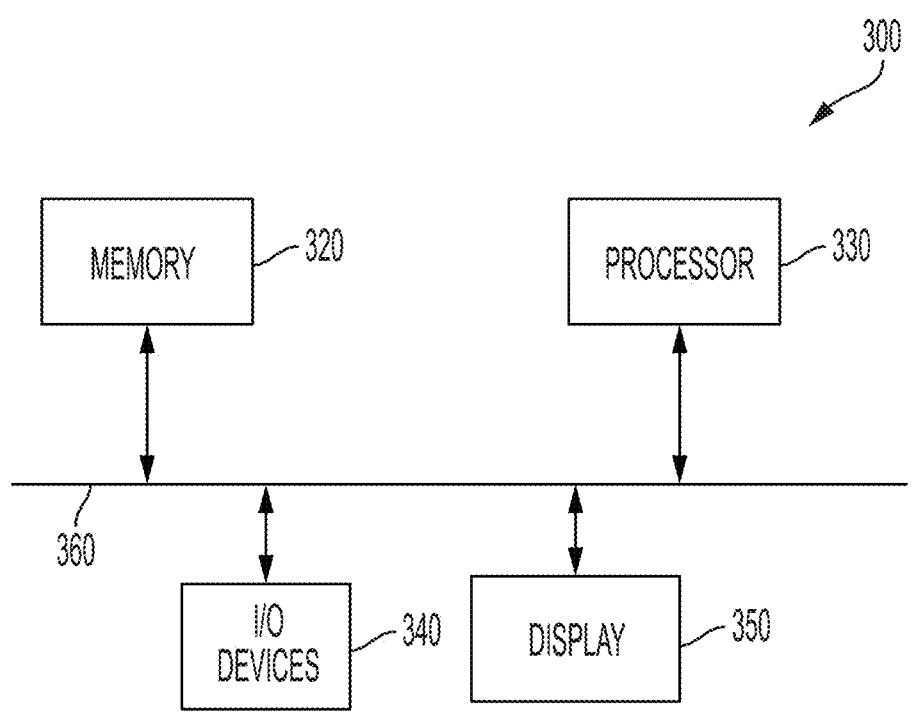
FIG. 4 illustrates a block diagram of a controller with a processor for executing instructions to automatically control the apparatus illustrated in FIG. 1 and FIG. 2 in accordance to an embodiment.

FIG. 4 illustrates a block diagram of a controller 300 with a processor for executing instructions to automatically control the apparatus illustrated in FIG. 1 and FIG. 2 in accordance to an embodiment.

The controller 300 may be embodied within devices such as a desktop computer, a laptop computer, a handheld computer, an embedded processor, a handheld communication device, or another type of computing device, or the like. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

The controller 300 may include a memory 320, a processor 330, input/output devices 340, a display 330 and a bus 360. The bus 360 may permit communication and transfer of signals among the components of the controller 300 or computing device.

Processor 330 may include at least one conventional processor or microprocessor that interprets and executes instructions. The processor 330 may be a general purpose processor or a special purpose integrated circuit, such as an ASIC, and may include more than one processor section. Additionally, the controller 300 may include a plurality of processors 330.

Memory 320 may be a random access memory (RAM) or another type of dynamic storage device that stores information and instructions for execution by processor 330. Memory 320 may also include a read-only memory (ROM) which may include a conventional ROM device or another type of static storage device that stores static information and instructions for processor 330. The memory 320 may be any memory device that stores data for use by controller 300.

Input/output devices 340 (I/O devices) may include one or more conventional input mechanisms that permit data between component of apparatus and for a user to input information to the controller 300, such as a microphone, touchpad, keypad, keyboard, mouse, pen, stylus, voice recognition device, buttons, and the like, and output mechanisms for generating commands, voltages to power actuators, motors, and the like or information to a user such as one or more conventional mechanisms that output information to the user, including a display, one or more speakers, a storage medium, such as a memory, magnetic or optical disk, disk drive, a printer device, and the like, and/or interfaces for the above. The display 350 may typically be an LCD or CRT display as used on many conventional computing devices, or any other type of display device.

The controller 300 may perform functions in response to processor 330 by executing sequences of instructions or instruction sets contained in a computer-readable medium with readable program code, such as, for example, memory 320. Such instructions may be read into memory 320 from another computer-readable medium, such as a storage device, or from a separate device via a communication interface, or may be downloaded from an external source such as the Internet. The controller 300 may be a stand-alone controller, such as a personal computer, or may be connected to a network such as an intranet, the Internet, and the like. Other elements may be included with the controller 300 as needed.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages like Perl or Python. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The memory 320 may store instructions that may be executed by the processor to perform various functions. For example, the memory may store instructions to execute the method described with reference to FIG. 5 and FIG. 9 and to control input/output functions like at display 350 for indicating all machine functions and accepting operator input of all the control information and which is easily used by a machine operator of ordinary skill.

Figure 5:
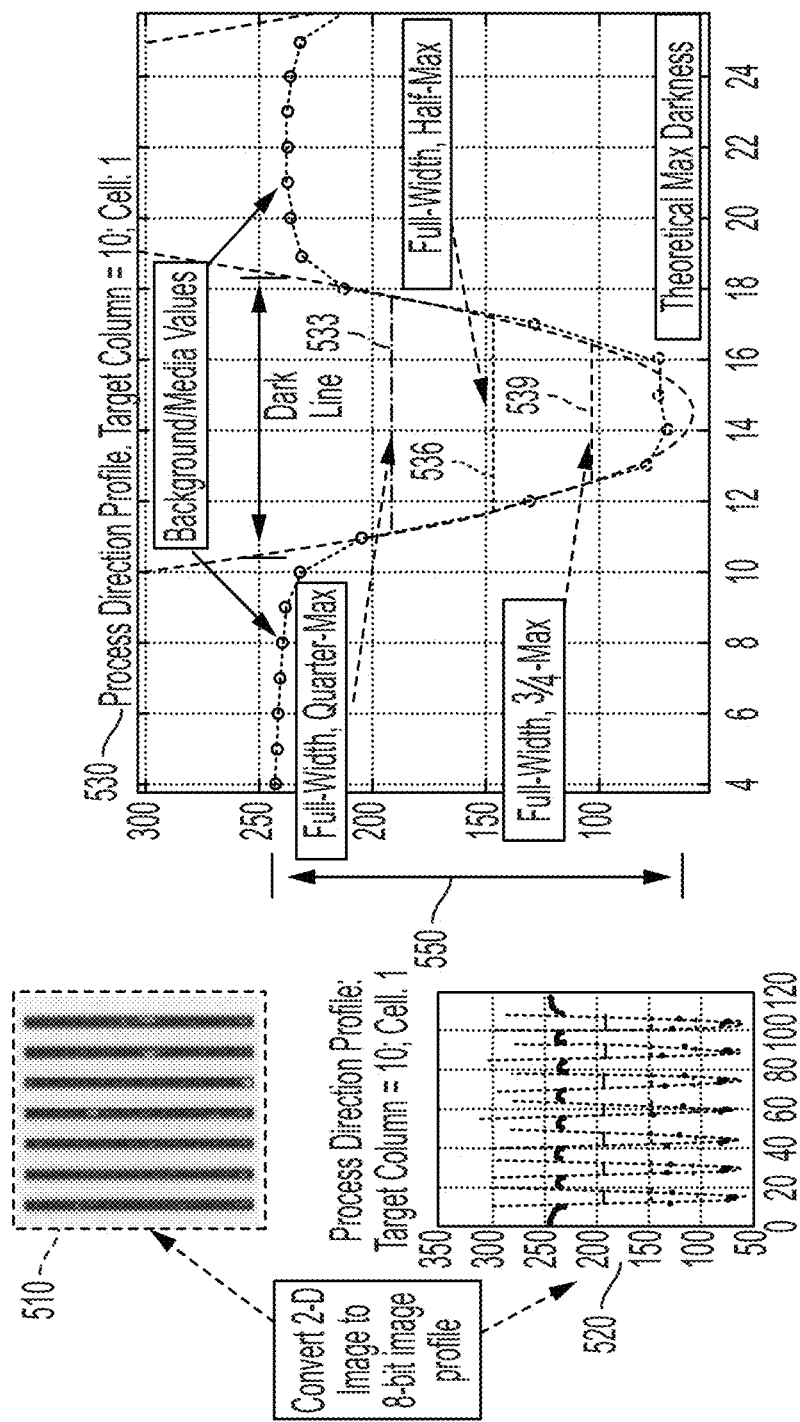
FIG. 5 illustrates a printed test pattern that is converted to an electronic image to calculate the dash width in accordance to an embodiment.

FIG. 5 illustrates a printed test pattern that is converted to an electronic image to calculate the dash width in accordance to an embodiment. As illustrated the printed test pattern (horizontal lines: column 10; printed using a cell (1) strategy of low impression and low ink setting) 510 is converted to an electronic image 520. The electronic image is then suitable for image analysis where, for each dash, using a quadratic fit equation, one can calculate width at different percentages of theoretical max darkness (which is minimum measured grey level). The quadratic fit takes the form of $Y \approx A(GL)X^2 + B(GL)X + C(GL)$, where A, B and C are coefficients of the quadratic equation which depend upon the measured grey level, GL. The quadratic fit for a dash is shown in image 530.

Continuing with FIG. 5, the range of grey level 550 expands the theoretical maximum and the grey level for the background or media color. As shown the range 550 can be segmented between at full-width quarter max (FWQM) 533, full-width half max (FWHM) 536, and full-width three quarter max (FW3QM) 539. From these segments a value for the number of pixels can be determined for each dash of the printed test pattern 510.

Figure 6A:
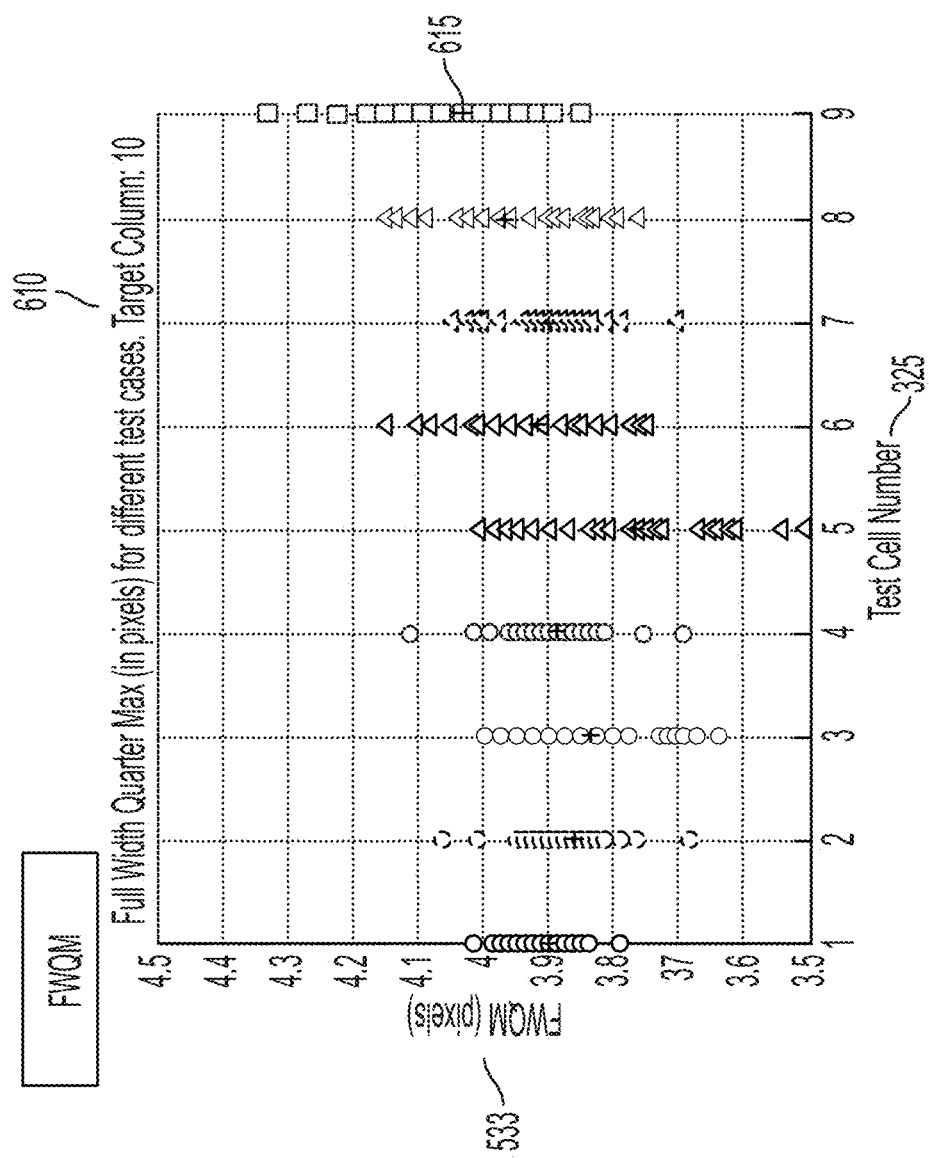
FIGS. 6A-6C are graphical representations of calculated number of pixels using full-width quarter max, full-width half max, and full-width three quarter max in accordance to an embodiment.
Figure 6B:
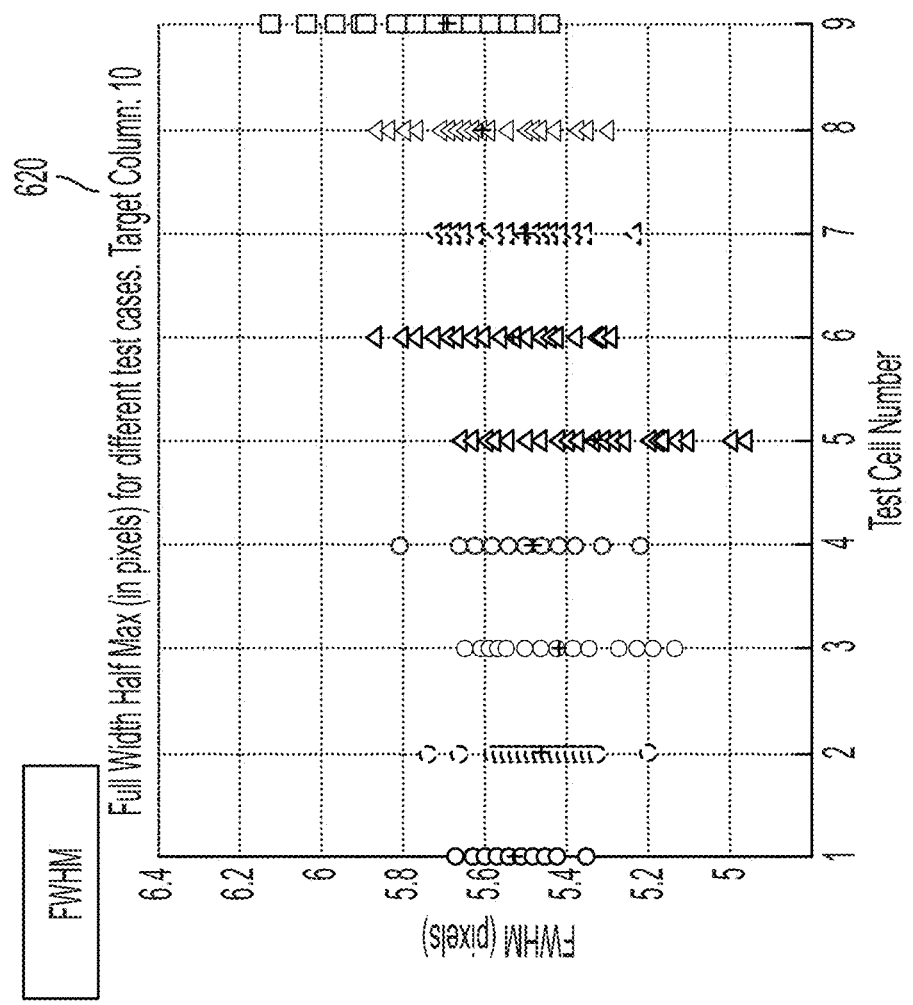
Figure 6C:
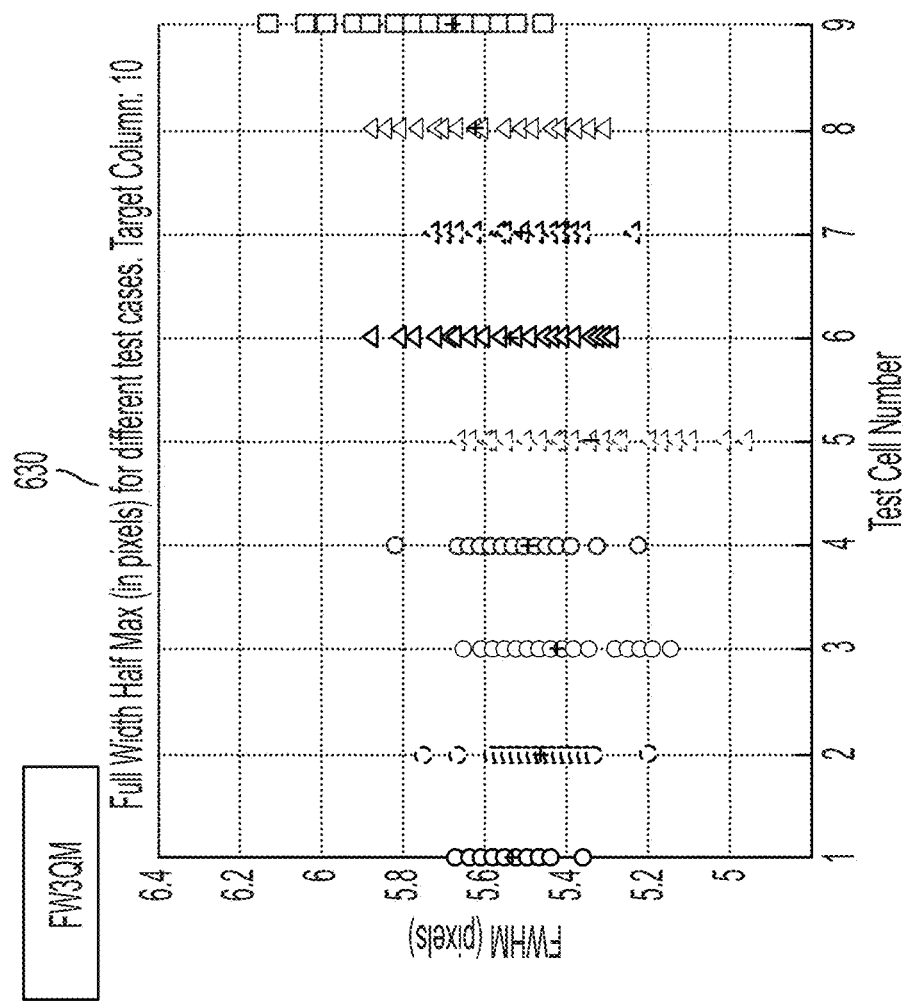

FIG. 6A-6C are graphical representation of calculated number of pixels using full-width quarter max, full-width half max, and full-width three quarter max in accordance to an embodiment. In FIG. 6A-6C the range of pixels 533 for a target test pattern (pattern 10 at FIG. 3A) is determined for each print strategy, cell number 325, and the average value for each cell. The first illustration 610 at FIG. 6A is the range and average 615 using FWQM 533, the second illustration 620 at FIG. 6B is the range and average for FWHM 536 and the third illustration 630 at FIG. 6C is the range and average for FW3QM 539.

Figure 7A:
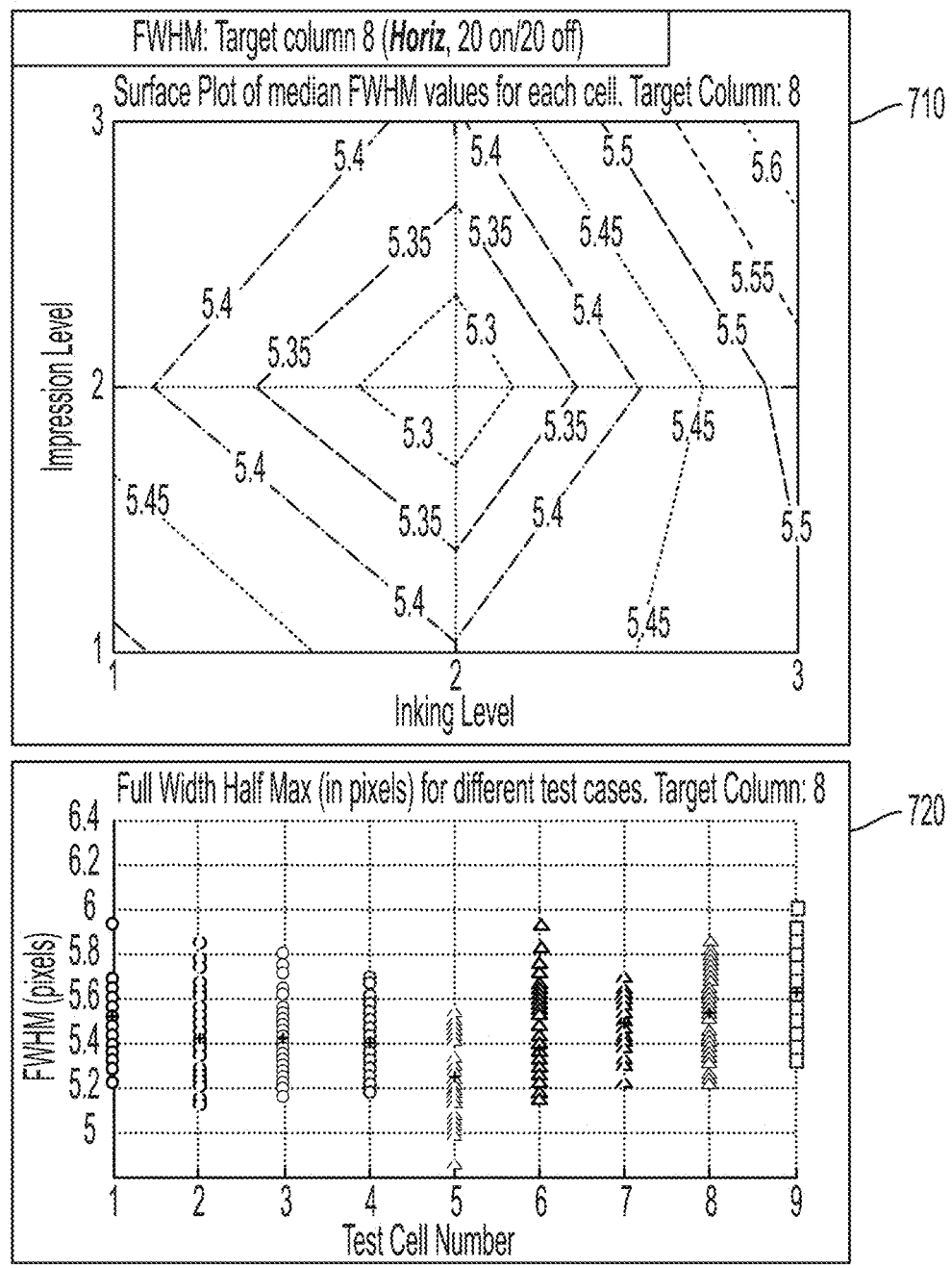
FIGS. 7A-7B illustrate representations as contour maps and scatter plots for different test cases in accordance to an embodiment.
Figure 7B:
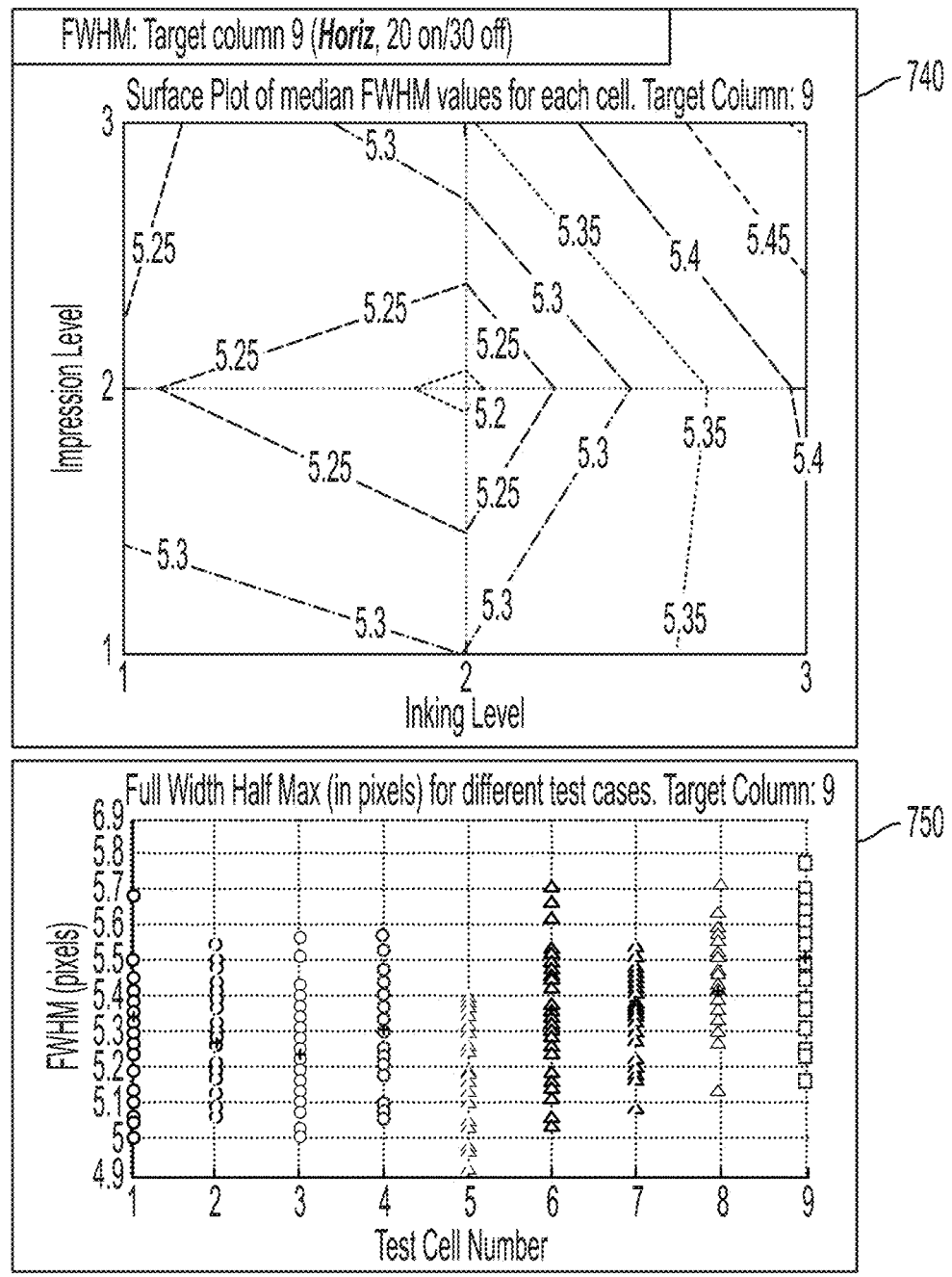

FIG. 7A-7B show representations as contour maps and scatter plots for different test cases in accordance to an embodiment. FIGS. 7A-7B show a contour map and scatter plot for test pattern 8 and test pattern 9. Contour map 710 at FIG. 7A illustrates the values at FWHM 536 for horizontal line (pattern 8) at different inking and impression levels. Illustration 720 is shows the range and average pixel values. Illustration 740 at FIG. 7B shows the contour map 740 for horizontal lines (column 9) and scatter plot 750 for the range and average pixel using FWHM 536 values for the quadratic approximation. As can be seen from the illustrations 710, 720, 740, and 750 the minimum Value is at normal levels of both impression and inking.

Figure 8A:
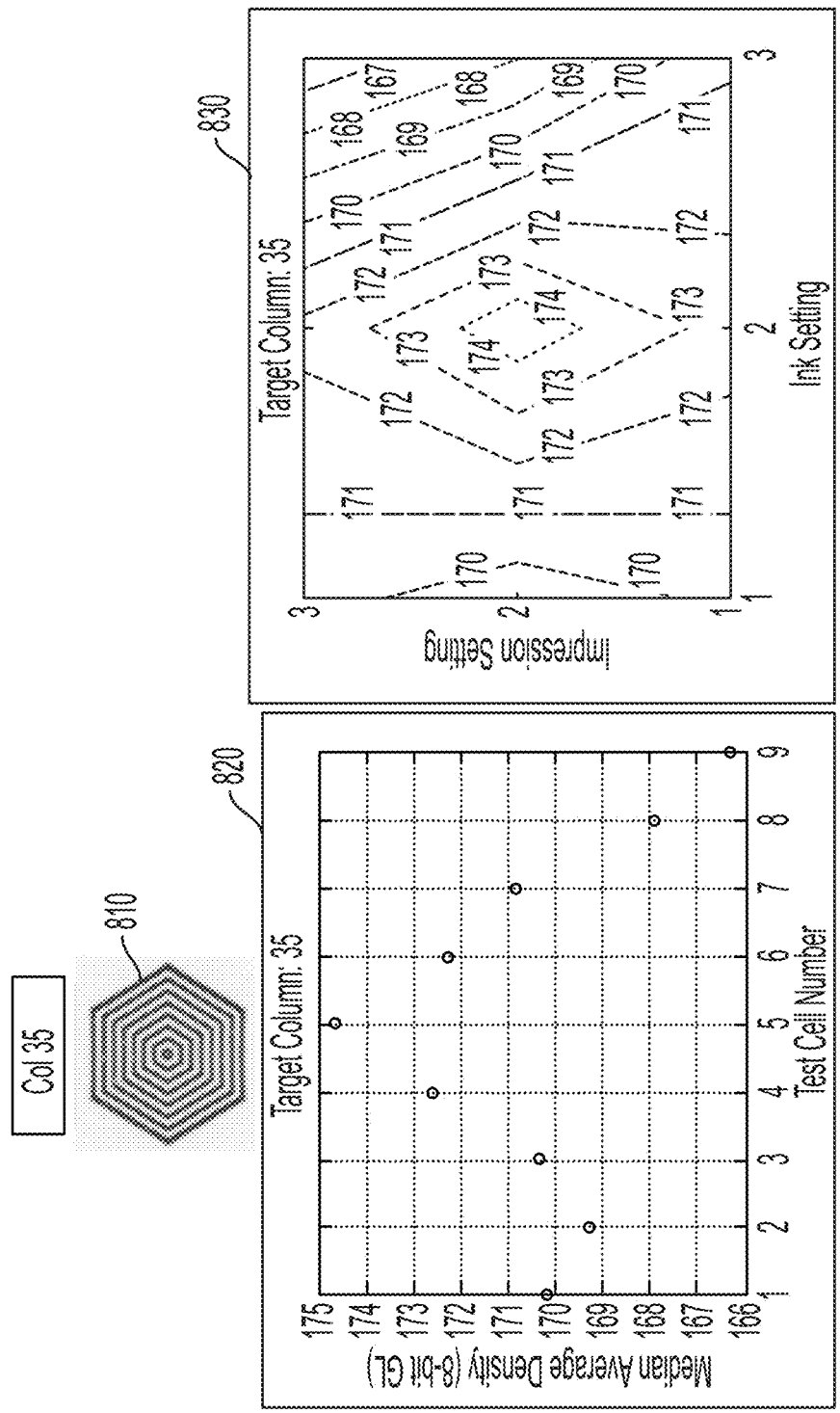
FIGS. 8A-8B illustrate representations as contour maps and scatter plots for a test circle pattern and a hexagonal test pattern in accordance to an embodiment.
Figure 8B:
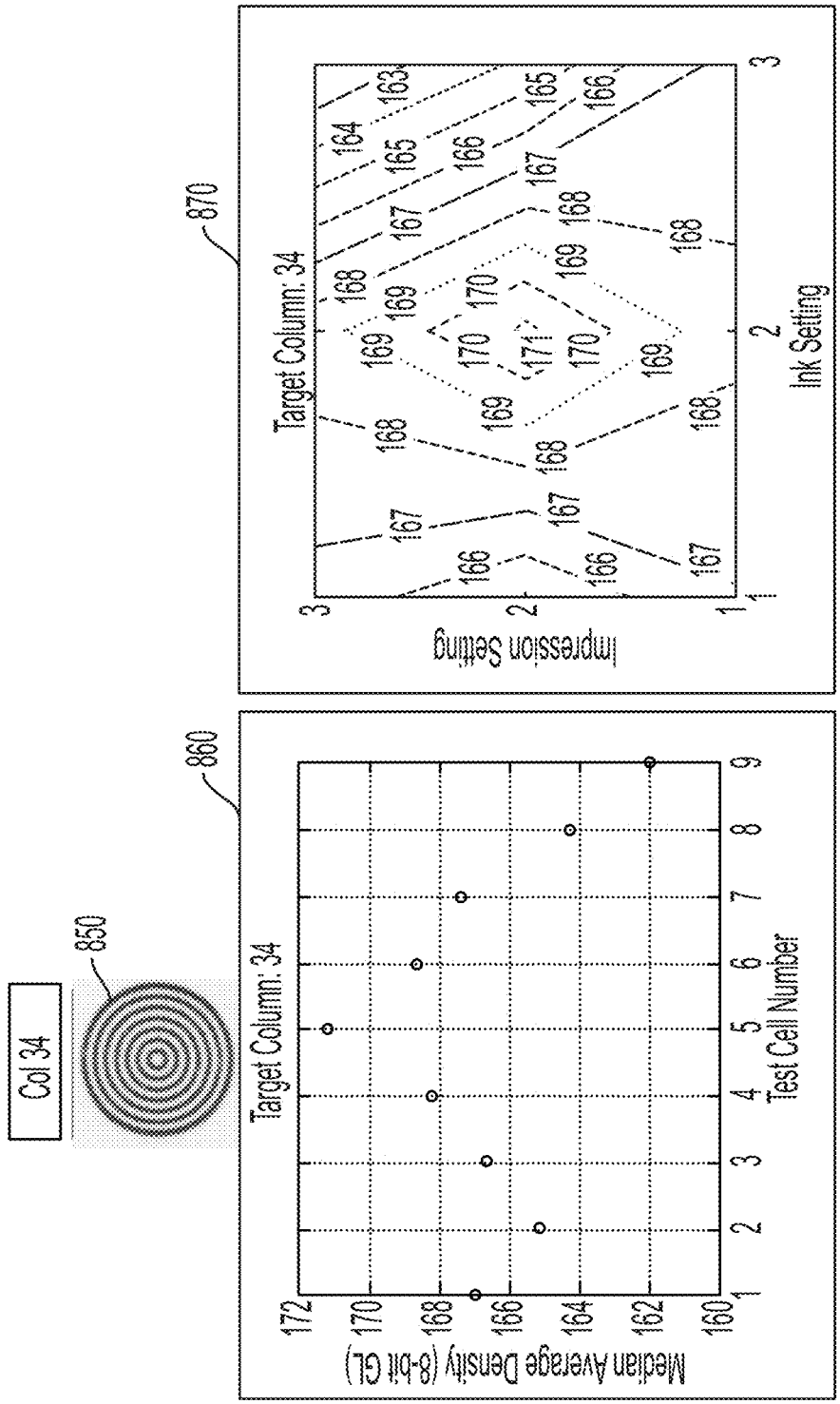

FIGS. 8A-8B illustrate representations as contour maps and scatter plots for a test circle pattern and a hexagonal test pattern in accordance to an embodiment. Contour map 830 and scatter plot 820 at FIG. 8A are from hexagonal shape 815 such as shape at column 35. Circular shape 850, Column 34 at 140G, produces a similar scatter plot 860 and contour map 870 at FIG. 8B. As shown, scatter plot 820 and scatter plot 860 show the average density for the different test cells for the hexagonal shape 810 and the circular shape 850. The following formula can be used to calculate average bit gray level:

$$\text{Normalized grey level} = 240 * \frac{(\text{avg } GL - \text{dark level})}{(\text{background} - \text{dark level})}$$

Where the background-dark level is shown as 550 in FIG. 5. The average grey level (GL) is calculated using the point within the quadratic fit as described in FIG. 5 like FWHM 536.

Figure 9:
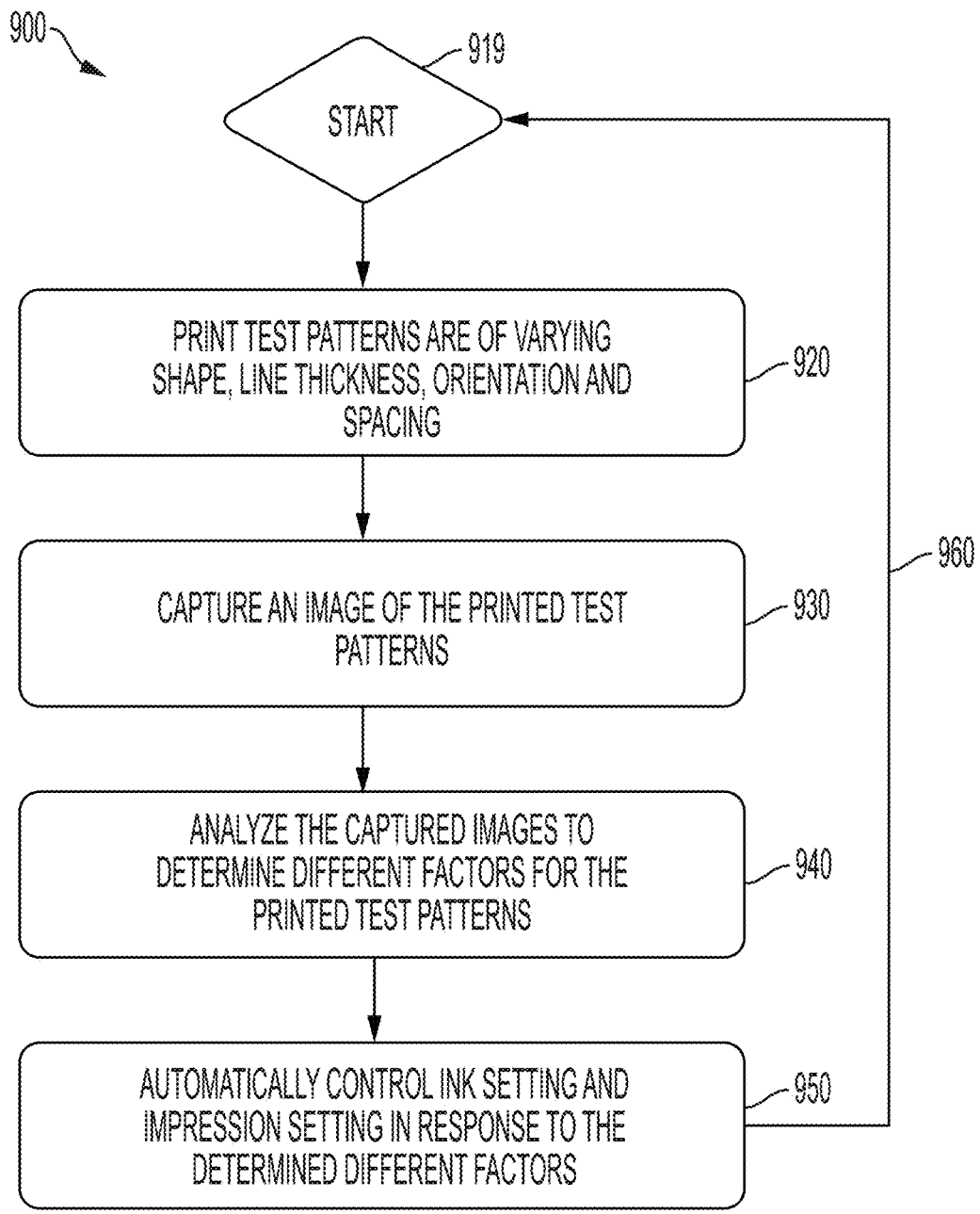
FIG. 9 illustrates a flowchart of a method for automatically controlling ink and impression settings for a flexographic printing system in accordance to an embodiment.

FIG. 9 illustrates a flowchart of a method 900 for automatically controlling ink and impression settings for a flexographic printing system in accordance to an embodiment. Method 900 begins with action 910 when the method is invoked to start the process for automatic optimization of inking and impression settings. The start can be called by the operator pressing a sequence or by the system at the beginning of a print job. In action 920, the flexographic printer commences the printing of test patterns on at least one substrate by applying different inking levels and impression levels, wherein the test patterns are of varying shape, line thickness, orientation and spacing. After completion of the printing action 920, the system in action 930 uses an imaging system or imaging device to capture at least one image of the printed test patterns on the at least one substrate at each of the impression/inking combinations. In action 940, the system analyzes the captured at least one image to determine different factors for the test patterns such as line and width and density. In action 950, the system through controller 300 automatically controls ink setting and impression setting from the determined different factors such as line width and density for the printed the test patterns.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A computerized method for automatic optimization of inking and impression settings in a flexographic printing system having a plate cylinder and an impression cylinder, the method comprising:
   print test patterns on at least one substrate at a nip between the plate cylinder and the impression cylinder by applying different inking levels and impression levels, wherein the test patterns are of varying shape, line thickness, orientation and spacing;
   using an imaging system downstream the nip to capture at least one image of the printed test patterns on at least one substrate at each impression/inking combinations;
   analyzing the captured at least one image to determine different factors for the test patterns, including a quadratic fit at multiple percentages of minimum gray level to determine average grey level; and
   using a control system to plot a contour surface map based on the different factors and interpreting the different factors to automatically control ink setting and impression setting responsive to the determined different factors, wherein the different factors are line width and density for the printed the test patterns.

2. The computerized method in accordance to claim 1, wherein the inking levels are selected from group consisting of low ink, normal ink, high ink, and combination thereof.

3. The computerized method in accordance to claim 2, wherein the impression levels are selected from a group consisting of low impression, normal impression, and high impression.

4. The computerized method in accordance to claim 3, wherein the test patterns are selected from a group consisting of horizontal lines, vertical lines, quadrant horizontal and vertical lines, radial shapes, hexagonal shapes, concentric circles, and combination thereof.

5. The computerized method in accordance to claim 4, wherein the test patterns include at least one of the horizontal lines and the vertical lines as a plurality of dashes, and the analyzing of the captured at least one image comprises for each dash determining a quadratic fit and calculating width at different percentage of theoretical max.

6. The computerized method in accordance to claim 5, wherein the different percentage of theoretical max is selected from Full-Width Quarter Max (FWQM), Full-Width Half Max (FWHM), and Full-Width Three Quarter (¾) Max (FW3QM).

7. The computerized method in accordance to claim 6, wherein test patterns consisting of horizontal lines and/or vertical lines are used to determine line width.

8. The computerized method in accordance to claim 6, wherein test patterns consisting of radial shapes, hexagonal shapes, and concentric circles are used to determine density.

9. The computerized method in accordance to claim 1, wherein the control system adjusts an ink key to dispense low ink, normal ink, or high ink.

10. The computerized method in accordance to claim 1, wherein the control system varies impression pressure to low impression, normal impression, or high impression.

11. A system for flexographic printing, comprising:
    an anilox roller having a patterned surface for transferring ink based on an inking setting to a flexographic printing plate;
    an impression cylinder that is configured to force based on an impression setting at least one substrate into contact with the flexographic printing plate;
    a processor coupled to a storage device having instructions that, when executed by the processor cause the processor to execute a method for automatic optimization of inking setting and impression setting by:
      printing test patterns on the least one substrate at a nip between the flexographic printing plate and the impression cylinder by applying different inking levels and impression levels, wherein the test patterns are of varying shape, line thickness, orientation and spacing;
      using an imaging system downstream the nip to capture at least one image of the printed test patterns on at least one substrate at each impression/inking combinations;
      analyzing the captured at least one image to determine different factors for the test patterns, including a quadratic fit at percentages of minimum gray level to determine average grey level; and
      using a control system to plot a contour surface map based on the different factors and interpreting the different factors to automatically control ink setting and impression setting responsive to the determined different factors, wherein the different factors are line width and density for the printed the test patterns.

12. The system for flexographic printing in accordance to claim 11, wherein the inking levels are selected from group consisting of low ink, normal ink, high ink, and combination thereof.

13. The system for flexographic printing in accordance to claim 12, wherein the impression levels are selected from a group consisting of low impression, normal impression, and high impression.

14. The system for flexographic printing in accordance to claim 13, wherein the test patterns are selected from a group consisting of horizontal lines, vertical lines, quadrant horizontal and vertical lines, radial shapes, hexagonal shapes, concentric circles, and combination thereof.

15. The system for flexographic printing in accordance to claim 14, wherein the test patterns include at least one of the horizontal lines and the vertical lines as a plurality of dashes, and the analyzing of the captured at least one image comprises for each dash determining a quadratic fit and calculating width at different percentage of theoretical max.

16. The system for flexographic printing in accordance to claim 15, wherein the different percentage of theoretical max is selected from Full Width Quarter Max (FWQM), Full-Width Half Max (FWHM), and Full-Width Three Quarter (¾) Max (FW3QM).

17. The system for flexographic printing in accordance to claim 16, wherein test patterns consisting of horizontal lines and/or vertical lines are used to determine line width.

18. The system for flexographic printing in accordance to claim 16, wherein test patterns consisting of radial shapes, hexagonal shapes, and concentric circles are used to determine density.

19. The system for flexographic printing in accordance to claim 11, wherein the control system adjusts an ink key to dispense low ink, normal ink, or high ink.

20. The system for flexographic printing in accordance to claim 11, wherein the control system varies impression pressure to low impression, normal impression, or high impression.

* * * * *